United States Patent
Ogle

[19]

[11] Patent Number: 6,105,241
[45] Date of Patent: Aug. 22, 2000

[54] FLIP FIXTURE FOR ASSEMBLING COMPONENTS TO A HEAT SINK

[75] Inventor: Daniel James Ogle, Garland, Tex.

[73] Assignee: Lucent Technologies, Inc., Murray Hill, N.Y.

[21] Appl. No.: 09/121,774

[22] Filed: Jul. 23, 1998

[51] Int. Cl.$^7$ ............................... B23P 19/02; B23Q 1/26
[52] U.S. Cl. ........................... 29/760; 29/759; 29/281.4; 29/281.5; 29/464; 269/71; 269/903
[58] Field of Search ............................ 29/757, 759, 760, 29/281.4, 281.5, 837, 739, 741, 834, 464; 269/903, 37, 71; 174/16.3

[56] References Cited

U.S. PATENT DOCUMENTS

| | | | |
|---|---|---|---|
| 3,669,478 | 6/1972 | Desmond et al. | 29/739 |
| 4,399,988 | 8/1983 | De Shong | 29/739 |
| 4,491,173 | 1/1985 | Demand | 269/903 |
| 4,527,620 | 7/1985 | Pedersen et al. | 269/903 |
| 4,809,430 | 3/1989 | Maruyama et al. | 29/739 |
| 4,890,382 | 1/1990 | Anderson et al. | 29/739 |
| 5,060,366 | 10/1991 | Asai et al. | 29/739 |
| 5,850,691 | 12/1998 | Bell | 29/837 |

*Primary Examiner*—Lee Young
*Assistant Examiner*—A. Dexter Tugbang
*Attorney, Agent, or Firm*—Locke Liddell & Sapp LLP

[57] ABSTRACT

A universal fixture has an alignment surface which temporarily holds a heat sink for installation of a plurality of electrical devices on its working surfaces. The fixture rotates about an axis to place an alignment surface in a first or second mounting position corresponding to a generally vertical orientation of the alignment surface. This corresponds to a horizontal position of the opposite first and second sides of the heat sink temporarily mounted thereon. Double rows of openings in the rotatable alignment member are universal in the sense they are configured to accept connection pins of the common packages to be clamped against the opposite sides of the heat sink. This permits one fixture to accommodate a variety of devices and arrangements. A unique standoff device supports smaller packages above the alignment surface to permit clamping across larger and smaller electrical devices without the necessity of attempting to manipulate and hold the devices by hand during the clamping operation. After the devices are clamped in position on the working surface of the heat sink, the heat sink and the devices are removed and the pins of the devices are preregistered for insertion into respective connection openings for the pins in an electrical wiring board.

12 Claims, 2 Drawing Sheets

FLIP FIXTURE FOR ASSEMBLING COMPONENTS TO A HEAT SINK

BACKGROUND OF THE INVENTION

1. Field of the Invention

The invention comprises a movable fixture for rapidly preassembling electrical devices (packages) on a heat sink ready for insertion on a printed wiring board.

2. Background of the Art

In the assembly of electronic equipment, packaged electrical or electronic devices which generate significant amounts of heat are placed in physical contact with heat sinks. The packages of the electronic devices include a sealed plastic cover and a plurality of connection pins extending from the package. It is customary to first assemble the electrical devices in physical contact with the heat sink and then clamp them in place. The assembled electrical devices are connected to a printed wiring board (PWB) by inserting the connection pins from the electrical devices into corresponding connection openings for the pins in the electrical board for soldering the connection pins to electrical leads in the board. Electrical devices that are power supplies commonly require in relation to their size, substantial heat sinks to carry the heat away during use.

In an effort to increase productivity of assembly line workers, prior art has used jigs of the kind shown in FIG. 1 in order to preassemble electrical devices (packages) onto heat sinks. The prior art jig has a base supporting a plate with a configuration of pin openings for an arrangement of electrical devices. The heat sink is temporarily mounted vertically on the plate and has a horizontal threaded opening for a screw which is used to clamp the electrical devices in place. The electrical devices are placed against the heat sink surface or against an electrically insulating layer thereon with the connection pins positioned in the openings. Plate-like clamping devices are tightened while holding the electrical devices positioned in place against the surface of the heat sink with the aid of the pins positioned in the opening of the plate.

Frequently the packages to be clamped against the heat sink are different sizes. Often it is necessary to have packages with shorter bodies than the other packages elevated from the surface of the plate where they must be held in the elevated position while being clamped. This becomes a difficult proposition trying to manipulate the clamps and tighten the screws or bolts while holding the electrical devices in the proper position so that the electrical devices are accurately positioned on the heat sink. It is also important that the main axis of the device be parallel with the openings so that the devices are not tilted slightly. If the devices are tilted, a bad connection can result when the pins are soldered or otherwise electrically connected to the PWB. It becomes an extraordinarily difficult proposition if electrical devices are being assembled on both sides of the heat sink and it becomes necessary to loosen one of the bolts for adjustment of the devices on the previously clamped side for some reason. In any event, it is difficult under best conditions to manipulate the electrical devices into the best proper position even with the aid of the jig shown in FIG. 1 when the bolts and clamping devices are installed horizontally.

SUMMARY OF THE INVENTION

The invention is a universal fixture for positioning a plurality of electrical devices in heat transfer contact on one or both of the opposite working sides of a heat sink. With the universal fixture, the electrical devices are quickly and easily properly positioned and clamped in place with their connection pins registered for insertion in a corresponding plurality of connection openings for the pins in an electrical board. The fixture comprises a base having a supporting surface with an elongated alignment member rotably mounted on the base for rotation about a rotational axis. The alignment member has an alignment surface rotable with the alignment member between a first mounting position and a second mounting position which is rotated about 180 degrees from the first mounting position and generally perpendicular to the supporting surface of the base. The alignment surface has a plurality of pin openings corresponding to a plurality of pin connection openings on an electrical board and a means for temporarily mounting a heat sink on the alignment surface. The working surfaces of the heat sink on which the devices will rest is also perpendicular to the alignment surface. Since the first and second mounting positions of the alignment surface are generally perpendicular to the base and the working surfaces of the heat sink are horizontally oriented, the electrical devices are conveniently and easily placed squarely and clamped on the first side of the heat sink. Then the fixture is flipped over to expose the opposite second side of the heat sink where an additional set of the same or a different plurality of electrical devices can similarly be simply laid in place and clamped.

The base includes a pair of stops positioned to hold the alignment surface alternately in each of first and second mounting positions generally perpendicular to the base. The stops are preferably located on the base on opposite sides of the alignment member to stop rotation of the alignment member by contact with a heat sink mounted on the alignment surface. The stops preferably provide an elongated surface generally parallel to the rotational axis of the alignment member and are adapted to support and stabilize the heat sink mounted on the alignment surface to help keep it from twisting or turning during the assembly process. The stops may comprise or include space apart posts extending from the supporting surface adapted to support and stabilize the heat sink so that it does not twist or wobble.

Rotation of the alignment member is facilitated by means of separated bearing blocks extending from the supporting surface on which the alignment member is rotably supported. A shaft aligned along the rotational axis supports the alignment member for rotation about the rotational axis and may include bearings which facilitate rotation.

The fixture includes a standoff having insertion pins which is adapted to position an electrical device having a shorter body and longer connection pins than at least one of the plurality of other electrical devices to be installed on a first or second side of the heat sink. The standoff is preferably configured with connection pin guides for quickly positioning connection pins on the electrical device having the shorter body for insertion into corresponding pin openings. The standoff is positioned immediately against the alignment surface with the electrical device having the shorter body placed above and against he standoff, spaced above the mounting surface. It is desirable to have the bodies of the electrical devices lying directly under the clamps so that they can be clamped without damaging the package. Packages can be damaged because they are clamped on an edge or at the top, for example, rather than having the clamping force distributed over a greater amount of area and preferably centered over the package. When the heat sink and the clamped on electrical devices are removed from the fixture, the standoff is easily taken away because it is not clamped by the clamps which hold the electrical devices.

The entire assembly is then free to be installed in its prearranged location of the pins into pin connection openings of a printed wiring board (PWB).

In the method for positioning a plurality of electrical devices having a plurality of connection pins onto opposite sides of a heat sink with the connection pins registered for insertion into corresponding connection openings for the pins in an electrical board, the method comprises providing an alignment member rotably mounted on the base for rotation about a rotational axis and an alignment surface rotable with the alignment member to a first mounting position and a second mounting position. The second mounting position is rotated about 180 degrees from the first mounting position and both first and second mounting positions are generally perpendicular to the supporting surface of the base. The alignment surface has a plurality of pin openings corresponding to pin connection openings on an electrical board. There is a means for mounting a heat sink having opposed first and second sides for mounting electrical devices on the alignment surface. The heat sink is mounted on the alignment member using the means for temporarily perpendicularly mounting.

The alignment surface is positioned at a first mounting position by rotation of the alignment member. A plurality of electrical devices are positioned on the first side of the heat sink by engaging the connection pins on the electrical devices with corresponding pin openings on the alignment surface and squaring them up. The electrical devices are clamped in that position on the first side of the heat sink. If only one side of the heat sink is to have the plurality of electrical devices, the heat sink with the clamped electrical devices is then removed from the fixture and the pins of the electrical devices are in register for being installed into the connection openings of the printed wiring board. If however, as is commonly the case, the heat sink is to have electrical devices on both sides, the alignment surface is moved to a second mounting position by rotation of the alignment member.

A plurality of electrical devices are positioned on the second side of the heat sink by interengaging the connection pins on the electrical devices with corresponding pin openings on the alignment surface and squaring them up. The plurality of electrical devices are clamped in that position and the clamped electrical devices and heat sink are removed from the alignment member ready for insertion of the connection pins into corresponding connection openings in a printed wiring board (PWB). If one of the electrical devices comprising the plurality of electrical devices has a short body as compared with at least one of the plurality of electrical devices, it is preferably positioned by means of the standoff previously described. Since the smaller short bodied electrical devices often have smaller diameter connection pins, it is preferable to include smaller diameter openings in the groups of pin openings in the alignment surface.

The fixture makes it possible to quickly and easily expose either the first or second side of the heat sink in a horizontal position temporarily fixed to the alignment surface. Then the electrical devices, with or without the use of the standoff, are simply laid in the proper position where gravity holds them in place. Since there is no tendency for them to move to an improper position, especially relative to any elevation they may have above the alignment surface, it is a simple matter to place the clamps in contact with the body of the devices and tighten the clamping screws to fix them in the proper position with little effort. When the whole assembly is flipped 180 degrees to expose the other side of the heat sink's working surface, a similar benefit is obtained in placing another plurality of same or differently sized electrical devices in a desired position, placing the clamps over the electrical devices and tightening the connection bolts to clamp them in place. Accuracy and productivity are enhanced by means of this improvement.

DESCRIPTION OF THE INVENTION

Figure 1:
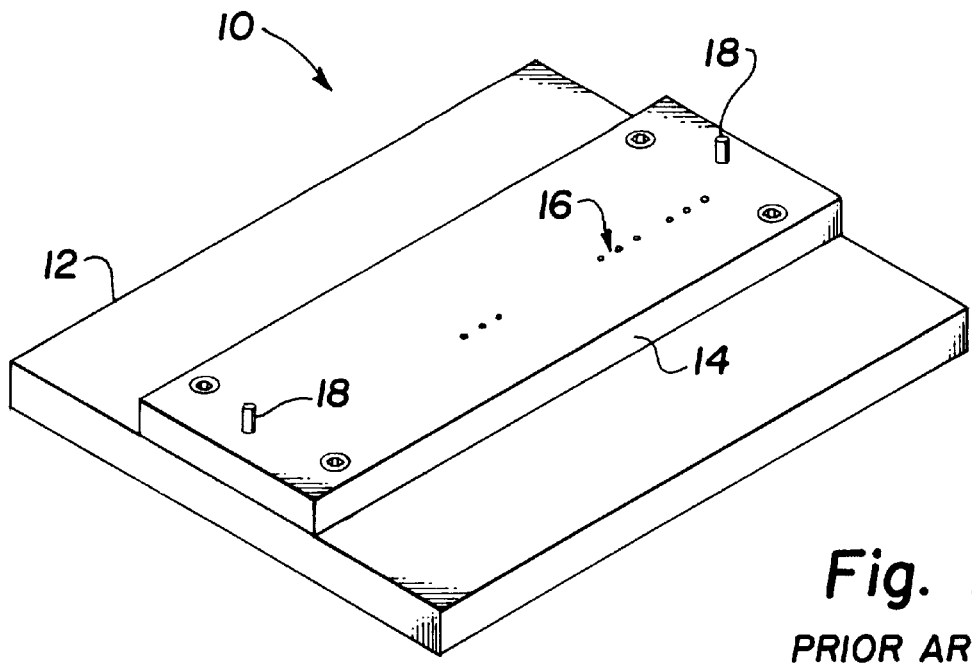
FIG. 1 is a perspective view of a prior art jig with a series of pin openings and posts for temporary installation of a heat sink in a vertical position.

In the description that follows, like parts will be referred to by the same reference numerals in so far as possible. The electrical devices being mounted are often referred to as packages in that they are sealed in a protective usually plastic housing with exposed contacts. For purpose of the description, the sealed package portion may be referred to as the body and the connections are referred to as pins which extend from the body.

In FIG. 1, prior art jig 10 has a base 12 with a plate 14 fixed thereto. Plate 14 includes a plurality of pin openings 16 and a pair of posts 18 fixed and extending from plate 14 to be received in corresponding openings in a heat sink in order to temporarily mount the heat sink on plate 14 in a vertical orientation. Jig 10 is ordinarily provided for a specific combination of electrical devices to be mounted on a particular heat sink. In this case, plate 14 is predrilled in three groups of openings for three electrical devices each having three connection pins.

Figure 2:
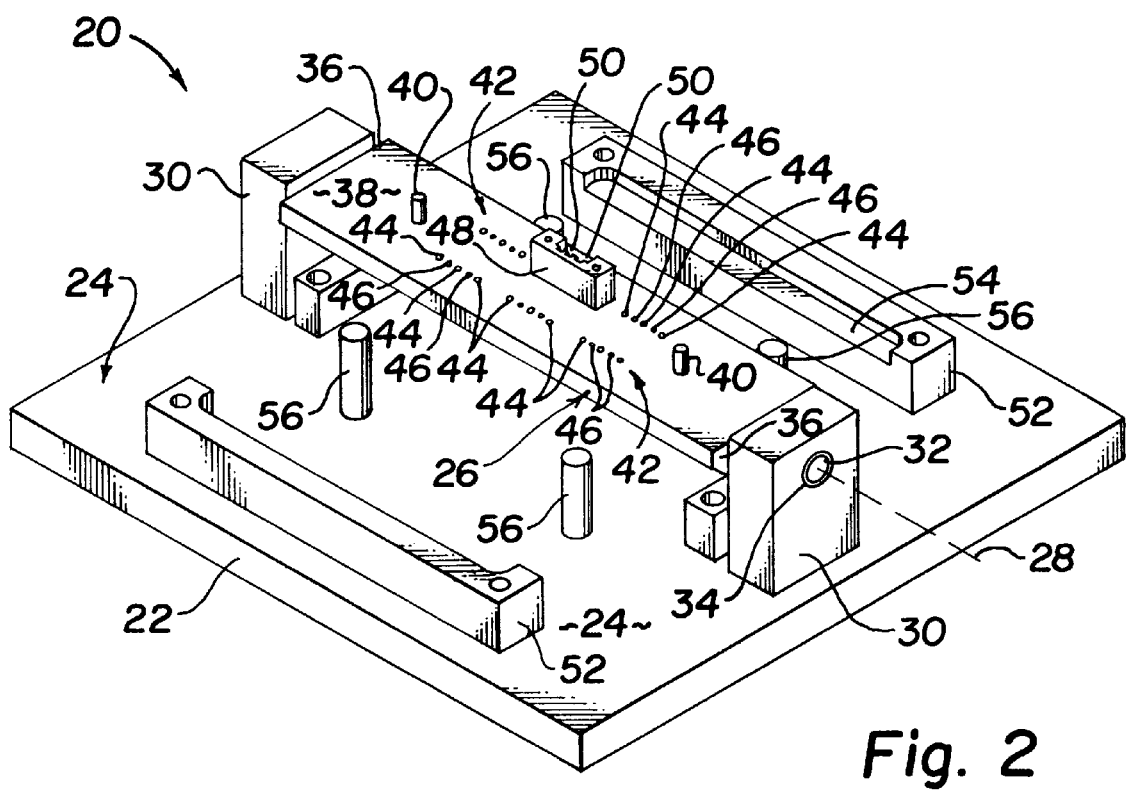
FIG. 2 is a perspective view of the improvement showing the alignment member and a standoff on the alignment surface.

FIG. 2 shows a perspective view of the universal flip fixture 20 without any of the electrical devices or the heat sink. Fixture 20 includes a base 22 having a supporting surface 24. An alignment member 26 is rotably mounted on base 22 for rotation about a rotational axis 28. A separated pair of bearing blocks 30 extend from support surface 24 to support alignment member 26. Alignment member 26 may be supported on a shaft 32 extending from opposite sides 36 of alignment member 26, which may be surrounded by bearings 34 to aid rotation. Alternately, bearing blocks 30 may comprise stub shafts which extend inwardly to fit in drilled openings in side edges 36 of alignment member 26. Bearing blocks 30 are preferably removably held in place by bolts from the underside of base 22 for assembly and disassembly.

Alignment member 26 has an alignment surface 38 illustrated as a planar surface 38 having a pair of posts 40 extending from surface 38. Posts 40 comprise a means for temporarily mounting a heat sink on alignment surface 38. Alignment surface 38 has a spaced apart double row 42, each having a plurality of pin openings 44, 46 which are arranged to correspond with a plurality of pin connection openings on an electrical board. Pin openings 44 are drilled perpendicularly into surface 38 and preferably extend therethrough.

Figures 3, 4:
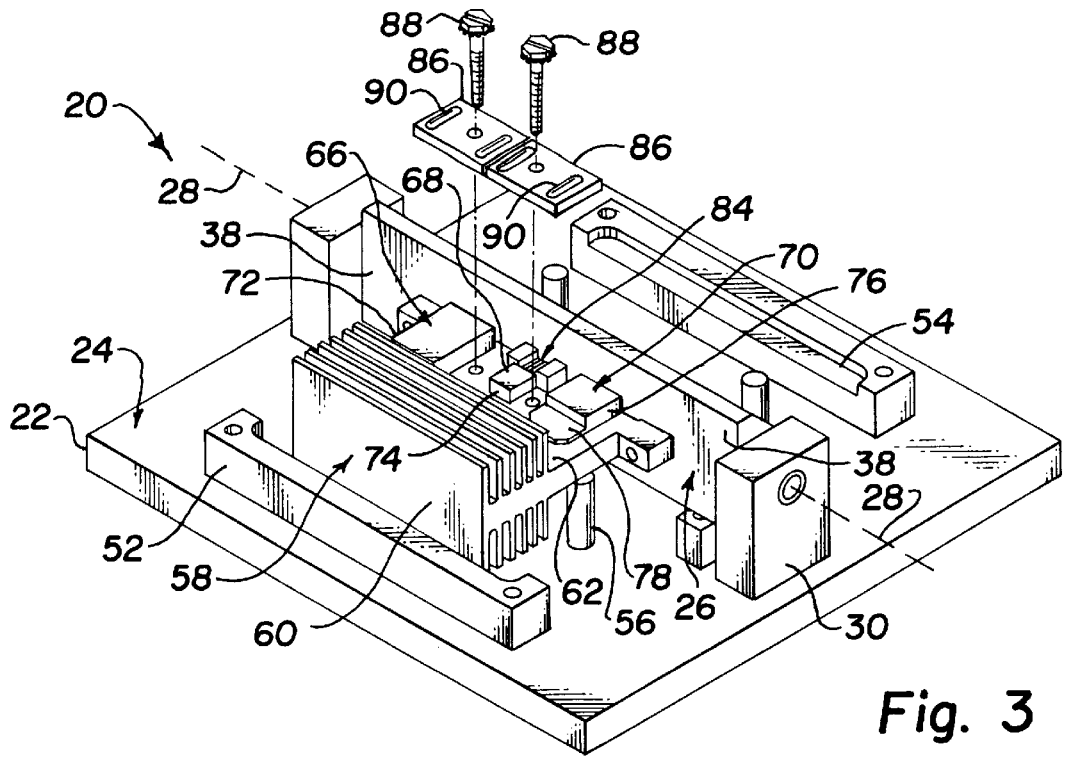
FIG. 3 shows a perspective view of the improvement of FIG. 2 with nearly completed installation of electrical devices on a first side of a heat sink in a first mounting position.
FIG. 4 is a plan view of the installation of FIG. 3 after the fixture with the heat sink is rotated to the second mounting position where in cut-away view, additional electrical devices are being installed on the second side of the heat sink.

In the preferred embodiment, each row 42 has three sets of pin openings spaced apart in a line along surface 38, containing three pin openings 44 in each of the three groups and two pin openings 46. In a preferred arrangement, each separated spaced group of openings in each row 42 from left to right comprise a pin opening 44, a pin opening 46, a pin opening 44, a pin opening 46, and a pin opening 44 so that the pin openings 44 are separated by pin openings 46 which are of a slightly smaller diameter than other pin openings 44. Standoff 48 has a pair of insertion pins 49 as are seen in FIG. 4 which fit pin openings 44. Standoff 48 is seen positioned for use in the middle group of openings on surface 38. Standoff 48 is a generally rectangular member having one side partially cut away and configured to contain connection pin guides 50 formed within standoff 48.

Smaller diameter connection pins 84 of which there may be two are often found on shorter bodied smaller electrical packages such as device 68. Therefore, it is desirable to provide two smaller openings 46 in each group of pin openings 44, 46 in alignment surface 38 in order to automatically establish a precise location for the smaller devices. It is understood that there may be more or fewer openings 44, 46 and they may be the same or different diameters in order to accommodate the pins of electrical devices that are to be attached to the working side surfaces of a heat sink. Most conveniently, the insertion pins of standoff 48 are the same size as the common pins on the larger electrical devices such as devices 66 and 70. This combination of openings 44, 46 makes it possible to mount electrical devices 66, 68, 70 at any of the six groups of openings on the alignment surface with or without one or more standoffs 48. Standoff 48 can be moved to any one of the six sets of openings in rows 42.

A pair of stops 52 are fixedly mounted on supporting surface 24 spaced apart on either side of alignment member 26. Stops 52 are configured with a shelf 54 which comprises an elongated surface which is designed to position the alignment surface alternately in each of the first and second mounting positions to be described. Finally, additional stops 56 are spaced apart laterally (with respect to axis 28) and on opposite sides of alignment member 26. Stops 56 separately or with stops 52 are adapted to support and stabilize the heat sink mounted on the alignment surface.

FIGS. 3 and 4 show how the fixture is utilized to simplify and speed up the positioning of electrical devices in the proper position on a heat sink. Heat sink 58 has an upper radiating portion 60 and a lower working surface comprising opposed first side 62 and second side 64. Sides 62, 64 are planar surfaces which receive a plurality of electrical devices 66, 68 and 70. Devices 66, 68 and 70 illustrate three variations of typical devices varying respectively in the relative size of the body portion 72, 74 and 76 which are represented by the different sizes shown in FIG. 3. Device 70 includes a metal base layer 78 which provides additional area for transmission of heat from the device to heat sink 58.

Referring now to FIG. 4, heat sink 58 has on either side of the working surfaces of sides 62, 64 an ear extending laterally containing an opening 80 which receives the post 40. The heat sink slips slightly loosely over the post where it is oriented with the surfaces 62, 64 perpendicular to alignment surface 38. Once heat sink 58 is placed over the post 40 from the position of FIG. 2, alignment member 26 is rotated counterclockwise so that alignment surface 38 is in the first mounting position shown in FIG. 3. The lower edge of upper portion 60 of heat sink 58 rests on shelf 54 of stop 52. The electrical devices 66, 68, 70 are laid flat on surface 62 and their pins 82 are inserted into one of the three sets of pin openings 44 as illustrated in FIG. 4. (Here the two additional openings 46 in the group of three openings 44 have been omitted for clarity.)

The relative arrangement of standoff 48 as installed without the smaller bodied electrical device 74 is shown in FIG. 4. Standoff 48 has a pair of insertion pins 49 slightly loosely disposed in two of the pin openings 44 in alignment surface 38 and extending through alignment member 26. Insertion pins 49 are shown as shorter than the length of openings 44, but the length is not material as long as the standoff is easily installed and held in position. FIG. 4 also shows a pair of connection pin guides 50 at the bottom of the open side of standoff 48. Guides have a grooved shape which cradle pins 84 of the smallest electrical device 68, seen only in FIG. 3. It can be seen that electrical device 68 is installed by placing its pins on the connection pin guides and inserting them into the spaced apart openings 46 which correspond with the pin openings. The bottom of body portion 74 rests upon the upper surface of standoff 48 thus holding device 68 in an elevated position with respect to surface 38.

The clamps commonly used to clamp the electrical devices in place are shown in FIGS. 3 and 4. The clamps are rectangularly shaped metal pieces with embossed pressing grooves 90 which have openings for receiving bolts 88. Heat sink 58 has a pair of threaded openings 91 for bolts 88. In FIG. 3, after placement of the three differently sized electrical devices 66, 68, 70, the pair of clamps 86 are placed against the bodies of the electrical devices and the bolts 88 threaded through the openings 91. The bolts are tightened to clamp the electrical devices in the proper position. After the universal fixture is flipped over to expose the underside in FIG. 4, and the desired additional number of electrical devices are similarly positioned with their connection pins in the connection pin openings, they are clamped in position. The ends of bolts 88 extend through heat sink 58 above the bodies of the electrical devices so the same bolts can be used to clamp the electrical devices in place. The openings of the clamps are passed over the exposed ends of the bolts and the clamps are laid across adjoining electrical devices. A bolt and lock washer 92 is tightened to clamp the electrical devices in place.

In the best mode the alignment member, its supports and the base are made of metal and the stops are made of a plastic material such as Delrin®. A particular arrangement of openings 44, 46 in alignment surface 38 of alignment member 26 are arranged to accommodate electrical device packages commonly known in the art as T0220 (small size), T0247 (medium size), and TO3P (large size) which correspond respectively to the devices 66, 68, 70.

I claim:

1. A flip fixture adapted to temporarily position on the fixture a heat sink having opposite sides for the purpose of mounting a plurality of electrical devices to opposite sides of the heat sink, the electrical devices being positioned with connection pins registered for insertion into a corresponding plurality of connection pin openings in an electrical board, the fixture comprising:

a base having a supporting surface;

an alignment member rotatably mounted on the base for rotation about a rotational axis, the alignment member having an alignment surface rotatable with the alignment member between a first mounting position and a second mounting position;

a double row of connection pin openings in the alignment surface, comprising a first row and a second row aligned and spaced apart in a manner to simulate the positioning and spacing of said connection pin openings in said electrical board;

the alignment member having means for temporarily mounting said heat sink having opposite sides, generally perpendicular to the alignment surface and intermediate the first and second rows of connection pin openings;

the alignment surface being rotatable between said first mounting position and said second mounting position which is about 180° of rotation from the first mounting position, for the purpose of alternately presenting opposite sides of the temporarily mounted heat sink in a horizontal orientation; and whereby the electrical devices having the connection pins can be alternately clamped against opposite sides of said temporarily mounted heat sink and positioned by the double row of connection pin openings so that connection pins on said electrical devices are ready for insertion into the corresponding connection pin openings in the electrical connection board.

2. The fixture of claim 1 further including a standoff having insertion pins and said plurality of pin openings include openings for the standoff insertion pins wherein the standoff is adapted to position one of said electrical devices, having a shorter body and longer connection pins than at least one of said plurality of electrical devices, spaced above the alignment surface.

3. The fixture of claim 2 wherein the standoff is configured with connection pin guides for quickly positioning the connection pins on the electrical devices having the shorter body into the corresponding pin openings in the alignment surface.

4. The fixture of claim 3 wherein the base includes stops which position the alignment surface alternately in each of the first and second mounting positions.

5. The fixture of claim 1 wherein the base includes stops which position the alignment surface alternately in each of the first and second mounting positions.

6. The fixture of claim 5 wherein said stops are located on the base on opposite sides of the alignment member to stop rotation of the alignment member by contact with the heat sink mounted on the alignment surface.

7. The fixture of claim 6 wherein said stops comprise an elongated surface generally parallel to the rotational axis which is adapted to support and stabilize the heat sink mounted on the alignment surface.

8. The fixture of claim 6 wherein said stops comprise spaced apart posts extending from the supporting surface which are adapted to support and stabilize the heat sink mounted on the alignment surface.

9. The fixture of claim 1 wherein the alignment member is rotatably mounted on the base by means of separated bearing blocks extending from the supporting surface.

10. The fixture of claim 9 wherein a bearing shaft aligned along the rotational axis supports the alignment member for rotation about the rotational axis.

11. The fixture of claim 10 wherein said shaft further includes bearings which support the alignment member for rotation about the axis of rotation.

12. The fixture of claim 9 wherein the base includes stops which position the alignment surface alternately in each of the first and second mounting positions.

* * * * *